(12) United States Patent
Burton

(10) Patent No.: US 6,400,028 B1
(45) Date of Patent: Jun. 4, 2002

(54) ALIGNMENT OF VIAS IN CIRCUIT BOARDS OR SIMILAR STRUCTURES

(75) Inventor: Edward Allyn Burton, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/119,467

(22) Filed: Jul. 20, 1998

(51) Int. Cl.[7] .............................................. H01L 29/40
(52) U.S. Cl. ...................................... 257/774; 257/758
(58) Field of Search ........................ 361/803; 257/700, 257/701, 774, 758

(56) References Cited

U.S. PATENT DOCUMENTS 5,548,099 A * 8/1996 Cole, Jr. et al. ......... 219/121.69
5,734,560 A * 3/1998 Kamperman et al. ....... 361/774

* cited by examiner

Primary Examiner—Roy Potter
(74) Attorney, Agent, or Firm—Kenyon & Kenyon

(57) ABSTRACT

An improvement is presented for connecting conductive components of a built-up circuit board. Rather than using vias or micro vias to connect a conductive layer to a conductive component separated by an insulating layer, an elongated via is used. In one embodiment, the elongated via has a length that is sufficient to directly coupled a first layer to the edge of a via in a lower layer. Thus, it can be said that the elongated via "self-aligns" with the via in the lower layer. In doing so, electrical connections from one side of a circuit board to a component coupled to the other side of the circuit board are more direct leading to a reduction in parasitic induction.

12 Claims, 5 Drawing Sheets

ALIGNMENT OF VIAS IN CIRCUIT BOARDS OR SIMILAR STRUCTURES

FIELD OF THE INVENTION

The present invention pertains to a method and apparatus for placing vias in circuit boards or the like. More particularly, the present invention pertains to the positioning of vias in adjacent layers of built-up multilayer type printed circuit boards, to allow more direct electrical connections between devices coupled to such printed circuit boards.

DESCRIPTION OF RELATED ART

As is known in the art, printed circuit boards (PCBs) provide a support structure allowing the interconnection of a plurality of devices coupled to the board. For example, in a simple version of a PCB, such as a so-called "FR4" PCB, an epoxy resin is provided that is reinforced with woven glass fibre cloth and treated to enhance its fire retardance. Conductive material is deposited in specific areas on the PCB. Space is made available on the surface of the PCB to allow components, such as integrated circuit (IC) chips, resistors, capacitors, etc. to be inserted or otherwise electrically bonded to the surface of the PCB. The conductive material, previously deposited on the PCB, provides an electrical connection between the components as desired.

PCB technology has advanced beyond providing electrical connections in a single layer. In so-called built-up multilayer (BUM) technology, a plurality of layers of conductive connections are provided with an insulating material, such as a dielectric material disposed between each layer. Individual layers are typically coupled together conductively with vias or micro-vias and plated through holes. A via is a depression in a surface of a first layer of the built-up PCB that penetrates through the insulating layer to a conductive area disposed on a lower layer. Typically, the insulating layer is etched in a specific area down to the level of the lower layer. Then, a conductive material is deposited (e.g., sputtered) on the insulating layer and into the etched area so as to create the electrical connection between the two conductive layers.

A plated through hole (PTH) is typically a hole drilled through the substrate of the PCB where the inner surface of the PTH is coated with a conductive material. A PTH provides an electrical connection between a conductive layer on a first or front side of the substrate to a conductive layer on a second or back side of the substrate. Examples of built-up multilayer (or high density multilayer) boards are sold by Ibiden USA Corp., and under the DYCOstrate® and TWINflex® marks by WurthElektronik GmbH (Rot am See, Germany).

Referring to FIG. 1, a cross section of a built-up PCB as is known in the art is shown. PCB surface layer 1 1 is the top surface of substrate 10 of a built-up PCB 1. A first conductive layer 12 is placed upon an insulating layer 14, and second conductive layer 13 is placed over first conductive layer 12 with an intermediate insulating layer 15. As seen in FIG. 1, a first via 21 electrically connects first layer 12 to PCB surface layer 11, a second via 22 electrically connects second layer 13 to first layer 12.

In the built-up PCBs described above, the PTHs are typically placed at the same distance away from one another. Thus, the term "PTH pitch" refers to the distance between corresponding points of two adjacent PTHs. In FIG. 1, the PTH pitch is set to 40 to 50 mils (where one mil equals one thousandth of an inch). It is accepted practice that a via on a first layer of a built-up PCB cannot be placed directly over a via in an adjacent layer. This is because doing so would electrically connect three adjacent layers in the PCB. Another accepted practice is that a via cannot be placed over a PTH. This is because of an assumed danger that doing so may cause one or more layers to collapse into the PTH. This practice is changing, however, and vias are now being placed over PTHs in the second or higher layer over the PTH.

Given the above limitations, the typical "via pitch" (distance between the center points of adjacent vias on a given layer) is typically set to twice the PTH pitch (e.g., 80 to 100 mils). Referring to FIG. 1, the optimal placement for via 22 is midway between vias 21 and 23 as further described below. If it is assumed that an IC circuit 30 (e.g., a controlled collapse chip connection (CCCC) mounted processor such as a Pentium® processor) is placed on a bottom side of PCB substrate 10, it is known in the art to provide a decoupling capacitor 25 electrically coupled to the IC circuit chip via PCB 1. Current travels from the IC chip through plated through hole 31 to capacitor 25 through vias 21 and 22. Given a via pitch that is twice the PTH pitch, the placement of via 22 midway between vias 21 and 23 provides the shortest current path between IC chip 30 and capacitor 25. In this example, the current path includes one-half of the PTH pitch (in layer 11) and one-half of the via pitch (in layer 12).

There are at least two problems that can occur with using the via system shown in FIG. 1. The first is an appreciable amount of so-called parasitic inductance and resistance that exists between IC chip 30 and capacitor 25. This is due in part to the length of the current path from IC chip 30 and capacitor 25 caused by the via pitch. The second problem pertains to a structure referred to as a power grid. Referring to FIG. 2, a top view of a built-up board is shown as is known in the art. Large conductive pads 40a, b, c are provided in the uppermost layer of the board and are coupled to a voltage supply or ground. When placing vias (e.g., vias 41a, b, c) in this uppermost layer, it is a general requirement that the via be placed completely within the large pads 40a, b, c so as to form a better electrical connection with the layer underneath this uppermost layer. Also, as stated above, the via is generally not to be placed above a PTH (e.g., PTH 42) which can typically reside directly below one of the pads 40a, b, c in the PCB substrate. Placing such vias in precise locations presents difficulties to the PCB manufacturer.

In view of the foregoing problems in built-up board technology, there is a need for an improved method and apparatus to electrically couple adjacent layers in a built-up PCB.

SUMMARY OF THE INVENTION

According to an embodiment of the present invention, an apparatus is provided to electrically couple a conductive layer to a conductive element. A first insulating layer is disposed below a first, upper conductive layer, and a conductive element is disposed below the first insulating layer. An elongated via in the first conductive layer and first insulating layer has a length sufficient to electrically couple the first conductive layer to the conductive element through the first insulating layer.

DETAILED DESCRIPTION

Figure 1:
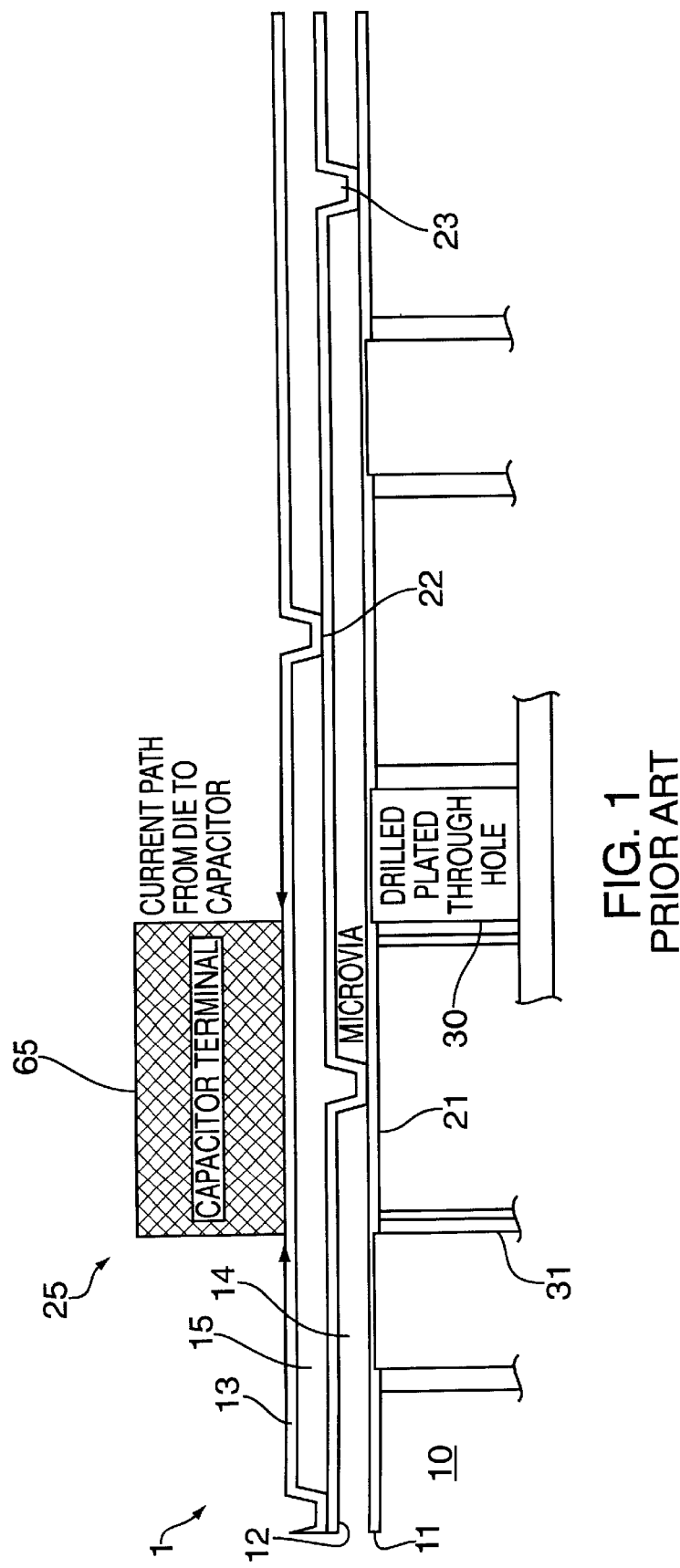
FIG. 1 is a cross-sectional side view of a built-up PCB as is known in the art.
Figure 2:
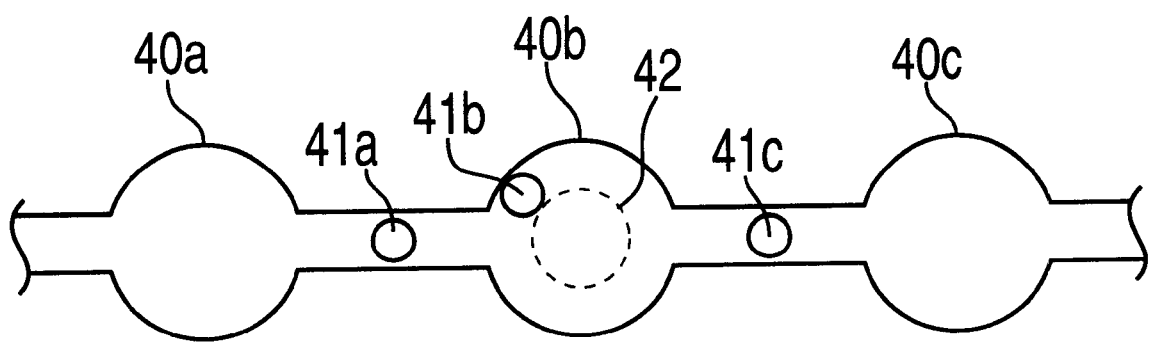
FIG. 2 is a plan view of a built-up PCB as is known in the art.
Figure 3:
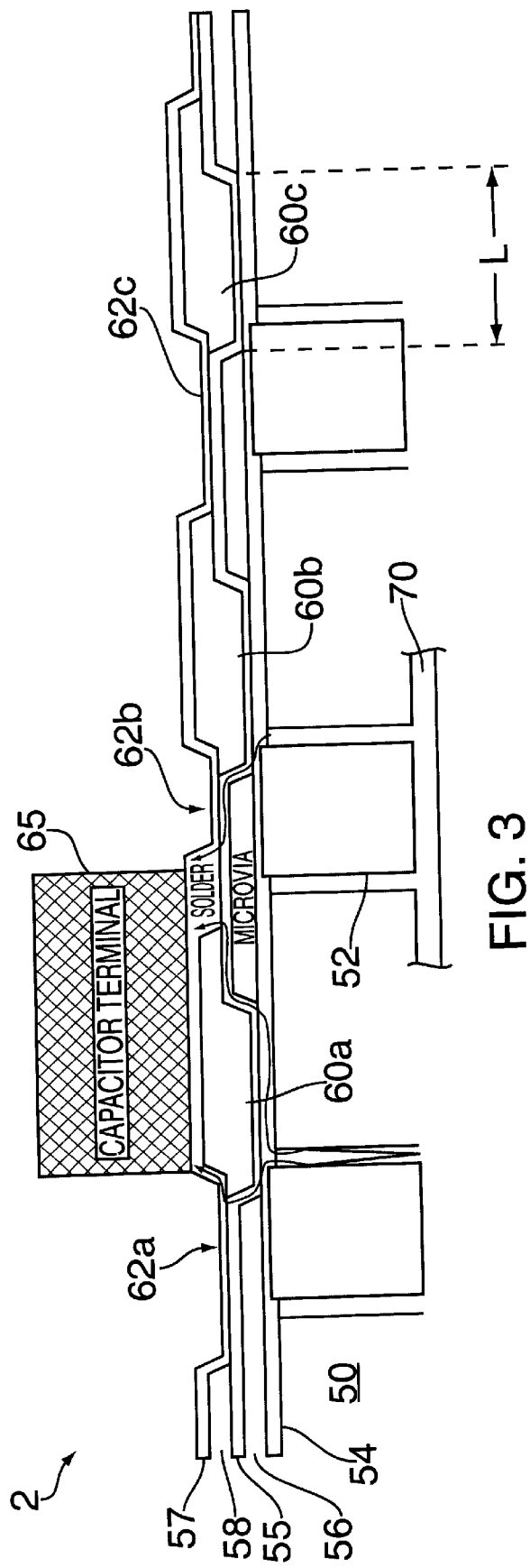
FIG. 3 is a cross-sectional side view of a built-up PCB constructed according to an embodiment of the present invention.

Referring to FIG. 3, a cross-sectional side view of a built-up PCB 2 constructed according to an embodiment of the present invention is shown. A PCB substrate 50 is provided which may include one or more plated through holes (e.g, PTH 52). Layer 54 is a top surface of PCB substrate 50. First layer 55 is separated from layer 54 by insulating layer 56 except at elongated vias 60a, b, c. According to an embodiment of the present invention, the length of an elongated via of layer 55 that extends through dielectric layer 56 to layer 54 is appreciably larger than a comparable length for the vias shown in FIG. 1. These elongated vias can be made using the same methods as with the vias of FIG. 1. For example, after a first conductive layer is provided having a via to a lower layer, an insulating layer is disposed on top of the conductive layer. Then, an elongated area is etched into the insulating layer so that it overlaps the via. Disposing conductive material on top of the insulating layer and the elongated etched area forms a second conductive layer and an elongated via. The elongated via couples the second conductive layer to the via in the first conductive layer.

In a first embodiment of the present invention, the elongated via in a first, upper layer, has a length sufficient to electrically couple the first layer directly to an edge of a via in a second, lower layer. For example, referring to FIG. 3, the length of elongated via 62b is sufficient so as to directly connect layer 57 to an edge of via 60b in layer 55. In a second embodiment of the present invention, the elongated via in a first, upper layer, has a length sufficient to electrically couple the first layer directly to an edge of plated through hole under the first layer. For example, referring to FIG. 3, the length of elongated via 60b is sufficient so as to directly connect layer 55 to an edge of PTH 52. Thus, according to embodiments of the present invention, the elongated via has a sufficient length so as to electrically and directly couple a first conductive layer to a conductive element such as an edge of a via or plated through hole, a point on a conductive trace in an adjacent layer, etc.

Using the elongated vias of the present invention, a more direct electrical connection can be made from an IC circuit 70 (e.g., a processor) through PCB 2 to capacitor terminal 65. In providing via 60b to couple layer 55 and layer 54, it is not known precisely where PTH 52 is on the PCB due to manufacturing tolerances. By elongating the via as described above, the electrical connection between the via 60b and the walls of PTH 52 is practically assured. In effect, via 60b "self-aligns" with PTH 52, even though the location of PTH 52 is only known approximately. Likewise, the elongation of via 62b of layer 57 ensures contact with via 60b in layer 55. Elongated via 62b "self aligns" with via 60b in layer 55 to provide a more direct flow of current from layer 55 to components coupled to layer 57. Accordingly, the flow of current from PTH 52 to capacitor terminal 65 is essentially straight through PCB 2 substantially reducing parasitic inductance resulting from the current flow.

Figure 4:
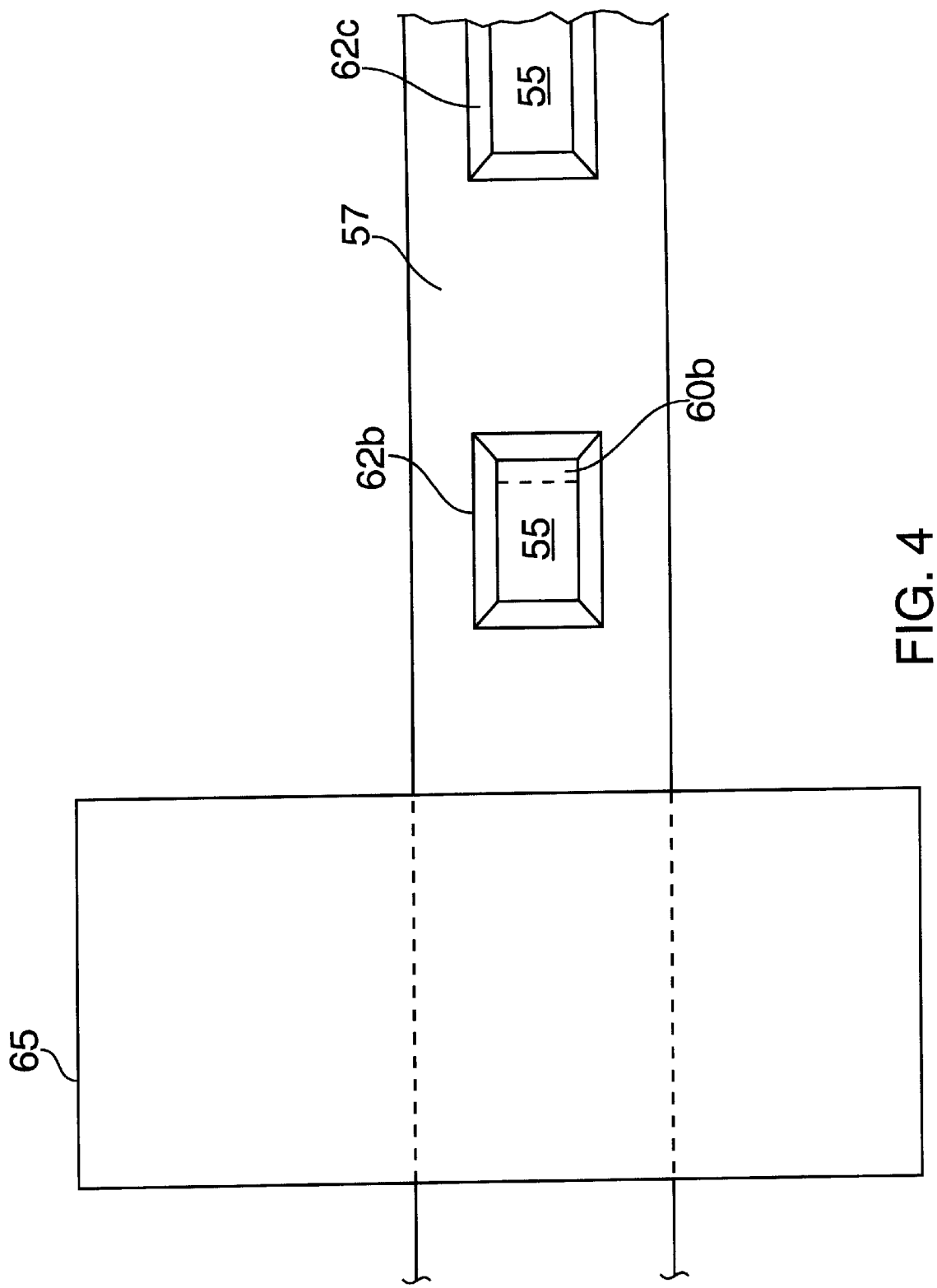
FIG. 4 is a plan view of the built-up PCB of FIG. 3.

Referring to FIG. 4, a plan view of a portion of PCB 2 is shown. Capacitor terminal 65 is coupled to layer 57 which may extend laterally from this component. Via 62b does not sever conductive layer 57, but extends downward to electrically couple layer 55 with layer 57. As seen in FIG. 4, via 62b is coupled directly to an edge of via 60b in layer 55. Accordingly, in this embodiment, current flows from via 60b in layer 55 and up any of the walls of via 62b to layer 57.

Figure 5:
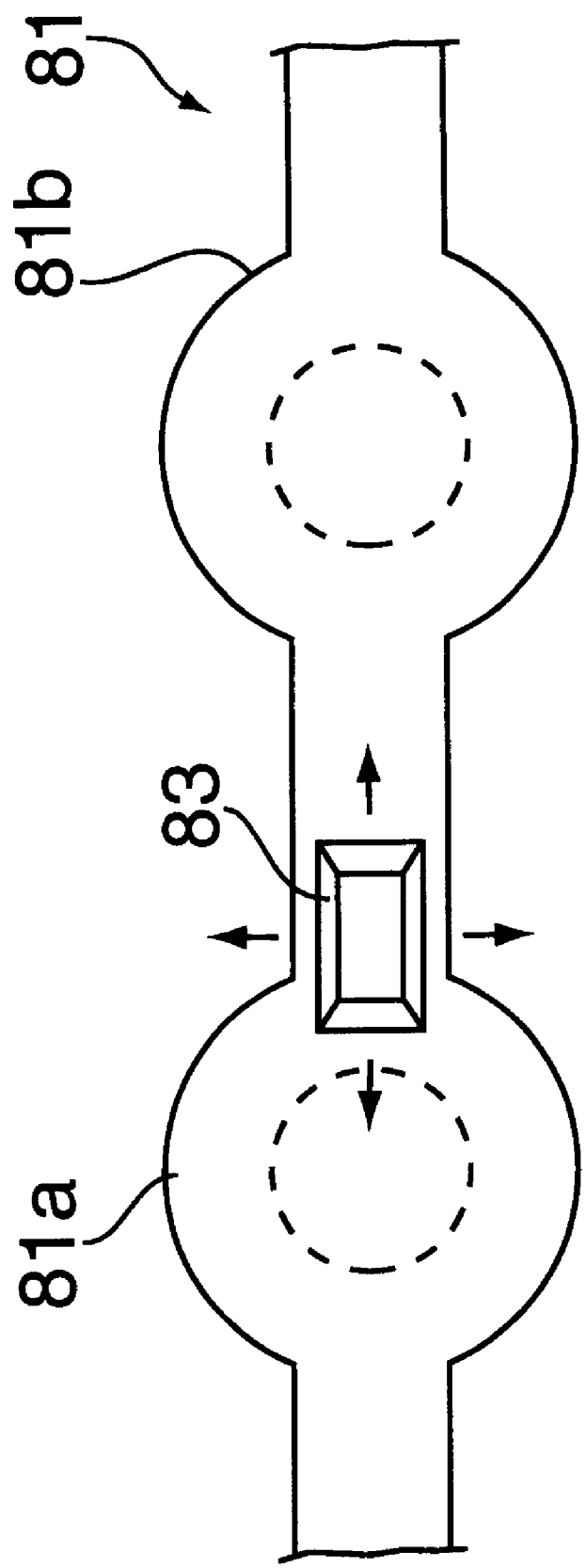
FIG. 5 is a plan view of another built-up PCB constructed according to an embodiment of the present invention.

Referring to FIG. 5, a plan view of a portion of another PCB 80 is shown having a power grid 81. Power grid 81 includes one or more relatively large pads 81a, 81b adapted to be coupled to a voltage supply, ground, etc. An elongated via 83 electrically couples pad 81a and a layer below power grid 81. As seen in FIG. 5, elongated via 83 can be moved in the directions indicated without losing contact with pad 81a, making the coupling of pad 81a to a layer below power grid 81 much easier.

Although several embodiments are specifically illustrated and described herein, it will be appreciated that modifications and variations of the present invention are covered by the above teachings and within the purview of the appended claims without departing from the spirit and intended scope of the invention.

What is claimed is:

1. An apparatus to electrically couple a conductive layer to a conductive element comprising:

a first upper conductive layer;

a first insulating layer disposed below said first conductive layer;

a conductive element disposed below said first insulating layer; and an elongated via in said first conductive layer and said first insulating layer, said elongated via having a length sufficient to electrically couple the first conductive layer directly to said conductive element.

2. The apparatus of claim 1, further comprising:

a second lower conductive layer disposed below said first insulating layer;

a second insulating layer disposed below said second conductive layer, wherein said conductive element is a via in said second conductive layer and said second insulating layer and said elongated via has a length sufficient to electrically couple the first conductive layer directly to an edge of the via.

3. An apparatus of claim 2 further comprising:

a substrate including a plated through hole disposed beneath said second insulating layer, said via in said second conductive layer and said second insulating layer is an elongated via having a length sufficient to electrically couple the second conductive layer to an edge of said plated through hole.

4. The apparatus of claim 3 further comprising:

a component electrically coupled to said first conductive layer.

5. The apparatus of claim 4 wherein said component is a capacitor.

6. The apparatus of claim 4 further comprising:

a processor coupled to said plated through hole of said substrate.

7. The apparatus of claim 5 further comprising:

a processor coupled to said plated through hole of said substrate.

8. An apparatus to electrically couple conductive layers of a circuit board comprising:

a first upper conductive layer;

a substrate including a plated through hole disposed below said first conductive layer;

a first insulating layer disposed between said first conductive layers and said substrate; and an elongated via in said first conductive layer and said first insulating layer having a sufficient length to electrically couple said first conductive layer directly to an edge of said plated through hole.

9. The apparatus of claim 8 further comprising:

a component electrically coupled to said first conductive layer.

10. The apparatus of claim 9 wherein said component is a capacitor.

11. The apparatus of claim 8 further comprising:

a processor coupled to said plated through hole of said substrate.

12. An apparatus to electrically couple a conductive layer to a conductive element comprising:

a first upper conductive layer;

a first insulating layer disposed below said first conductive layer;

a second lower conductive layer disposed below said first insulating layer;

a second insulating layer disposed below said second conductive layer;

a via in said second conductive layer and said second insulating layer;

an elongated via in said first conductive layer and said first insulating layer, said elongated via having a length so as to overlap said via in said second conductive layer and said second insulating layer.

* * * * *